United States Patent [19]

Park

[11] Patent Number: 5,710,734

[45] Date of Patent: Jan. 20, 1998

[54] SEMICONDUCTOR MEMORY DEVICE AND DATA WRITING METHOD THEREOF

[75] Inventor: Jun Bae Park, Kyungsangnam, Rep. of Korea

[73] Assignee: LG Electronics Inc., Rep. of Korea

[21] Appl. No.: 589,536

[22] Filed: Jan. 22, 1996

[30] Foreign Application Priority Data

Jan. 24, 1995 [KR] Rep. of Korea .................. 1172/1995

[51] Int. Cl.$^6$ ........................................ G11C 7/00
[52] U.S. Cl. ........................ 365/185.09; 365/189.07
[58] Field of Search ........................ 365/185.09, 201, 365/189.01, 189.07

[56] References Cited

U.S. PATENT DOCUMENTS

| | | | |
|---|---|---|---|
| 4,064,558 | 12/1977 | Hughes et al. | 395/417 |
| 5,222,232 | 6/1993 | Fujioka | 395/575 |
| 5,243,561 | 9/1993 | Yamauchi | 365/189.12 |
| 5,367,484 | 11/1994 | Alexander et al. | 365/185.09 |

FOREIGN PATENT DOCUMENTS 0492450  7/1992  European Pat. Off. .

*Primary Examiner*—Joseph A. Popek

[57] ABSTRACT

An improved semiconductor memory device and a data writing method thereof capable of preventing semiconductor memory breakage and written data error which occur when data are predominantly written on a certain address by evenly writing the data on each address of a memory device, which includes a data region for writing a data; and a counter region for counting the number that a data is written on the data region.

8 Claims, 3 Drawing Sheets

SEMICONDUCTOR MEMORY DEVICE AND DATA WRITING METHOD THEREOF

BACKGROUND OF THE INVENTION

1. Field of the Invention

The present invention relates to a semiconductor memory device and a data writing method thereof, and in particular to an improved semiconductor memory device and a data writing method thereof capable of preventing semiconductor memory breakage and written data error which occur when data are predominantly written on a certain address by evenly writing the data on each address of a memory device.

2. Description of the Conventional Art

As well known to those who skilled in the art, the memory device which are used for a computer program should have a characteristic that the data written on the memory device can not be lost even though power supply is instantly blocked. In order to meet the above-mentioned requirement, in the industry, an Electrically erasable and programmable ROM (EEPROM) has been used. Here, the EEPROM has a non-volatile characteristic and is capable of writing data after data is erased even though power supply is instantly blocked.

FIG. 1 shows a conventional circuit between a microcomputer and an EEPROM. The EEPROM includes a terminal which selects a chip selection signal CS with which a microcomputer 10 selects an EEPROM 20, a terminal which outputs a ready signal RDY by which it is possible to check whether the EEPROM 20 is in a ready state to perform a certain operation or is in an operation and to report a result to the microcomputer, a terminal which receives a clock signal CLK outputted from the microcomputer so as to synchronization of the EEPROM 20 when a chip selection signal CS and a ready signal RDY are available, input/output terminals DI and DO for communicating with the microcomputer 10, and a terminal Vd and a ground terminal GND for receiving power voltage Vdd from an externally connected power terminal, and a terminal which receives a certain signal ORG for a proper memory construction.

Here, the signal ORG serves to determine a data format between the microcomputer 10 and the EEPROM 20, and when the signal ORG is applied to the voltage Vdd terminal, and the data is applied to the ground by a 16 bit unit, the signal ORG is processed by an 8 bit unit. Meanwhile, the capacitor C serves as an element for removing noise.

The operation of the conventional semiconductor memory device and a data writing method thereof will now be explained with reference to FIGS. 2 and 3.

To begin with, the operation in which data is written on the EEPROM 20 will now be explained. When the microcomputer 10 writes a certain data on the EEPROM 20, a writing request command is generated. When the writing request command is generated, the microcomputer 10 outputs a chip selection signal CS for selecting a certain EEPROM 20. As the chip selection signal CS is applied thereto, the EEPROM 20 outputs a ready signal RDY, which indicates a certain state that the EEPROM 20 is in a certain ready state for performing a certain operation or is in an operation, to the microcomputer 10. As a result after judging the existence of the ready signal RDY, when the EEPROM 20 is in an operation that the EEPROM 20 performs a certain operation, the microcomputer 10 selects another EEPROM or waits until the EEPROM 20 becomes in a ready state. As a result after judging the existence of the ready signal RDY, when the EEPROM 20 is not in an operation, the microcomputer 10 outputs an address, on which a data is written, to the input terminal DI of the EEPROM 20 together with a clock signal CLK. Thereafter, the microcomputer 10 outputs a writing command to the input terminal DI of the EEPROM 20 and outputs the data to be written on the address to the EEPROM 20 through the input terminal DI and ends the operation.

Meanwhile, when reading a certain data to be written on the EEPROM 20, the microcomputer 10 generates a reading request command and outputs a chip selection signal CS for selecting a certain EEPROM 20 as is the same as the writing operation. When the chip selection signal CS is applied thereto, the EEPROM 20 outputs a ready signal RDY, which indicates whether the EEPROM 20 is in a ready state of performing a certain operation or is in an operation, to the microcomputer 10. As a result after judging the existence of the ready signal RDY, when the EEPROM 20 is in an operation, the microcomputer 10 selects another EEPROM or waits until the EEPROM 20 becomes a ready state. As a result of after judging the existence of the ready signal RDY, when the EEPROM 20 is not in an operation, the microcomputer 10 outputs an address, on which a data to be read is written, to the input terminal DI of the EEPROM 20. Thereafter, when the microcomputer 10 outputs a reading command to the EEPROM 20 through the input terminal DI, and the EEPROM 20 reads the data written on a corresponding address and outputs to the microcomputer 10 through the output terminal DO and ends the operation.

However, as shown in FIG. 4, when writing/reading data on the conventional EEPROM 20, data is sequentially and predominantly written on a certain address. In addition, when data writing is performed with respect to the system in which certain characteristic and requirement are required, if the data is predominantly written on a certain address a certain number times for example, about 10,000 through 100,000 times, the corresponding address can be broken or write data errors occur, so that the life span of the EEPROM is decreased.

SUMMARY OF THE INVENTION

Accordingly, it is an object of the present invention to provide a semiconductor memory device and a data writing method thereof, which overcome the problems encountered in a conventional semiconductor memory device and a data writing method thereof.

It is another object of the present invention to provide an improved semiconductor memory device and a data writing method thereof capable of preventing semiconductor memory breakage and written data error which occur when data are predominantly written on a certain address by evenly writing the data on each address of a memory device.

To achieve the above objects, there is provided a semiconductor memory device, which includes a data region for writing a data; and a counter region for counting the number of times that data is written on the data region.

To achieve the above objects, there is provided a data writing method for a semiconductor memory device, which includes a first step which reads the number of times that data is written on a certain address of a data region when a data writing request is given; a second step which designates a certain address as an address on which a data is written when the read value is less than a certain value and writes the data thereon; and a third step which selects another address of the data region when the read value is larger than a certain value and repeats the first and second steps.

DETAILED DESCRIPTION OF THE INVENTION

Figure 5:
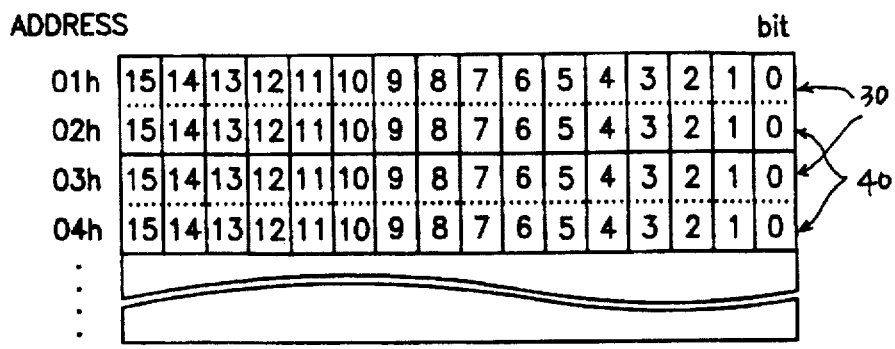
FIG. 5 is a view of a construction of an EEPROM according to the present invention.
Figure 6:
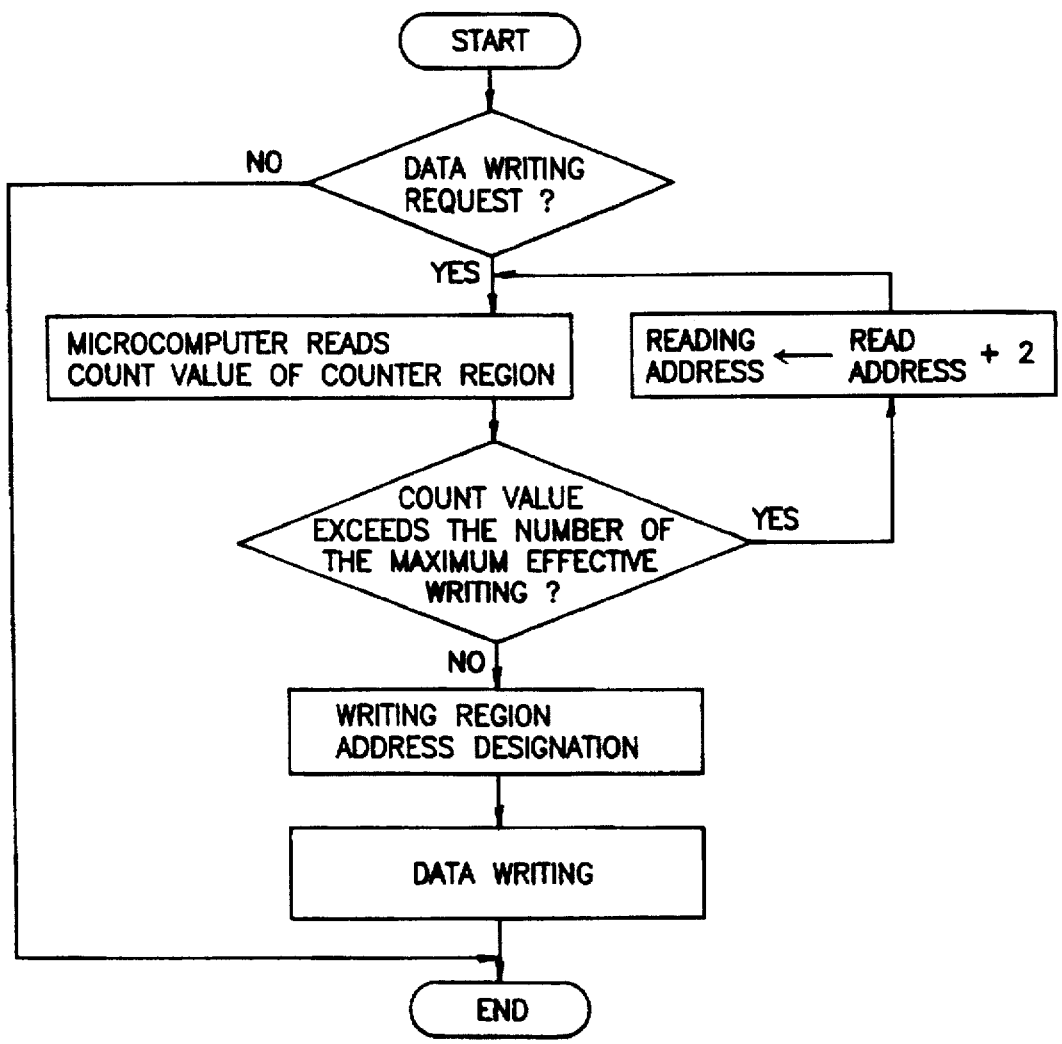
FIG. 6 is a flow chart of a method of writing data on an EEPROM according to the present invention.

FIG. 5 shows a construction of an EEPROM according to the present invention, which consists of a pair of addresses.

Each first address, that is, odd number addresses ($\phi$1h, $\phi$3h, $\phi$5h ...), of each pair of the addresses is used for a region 30 for storing data, and each second address, that is, even number addresses ($\phi$2h, $\phi$4h, $\phi$6h ...), of each pair of the addresses is used for a counter region 40 for counting the number that the data is written on the data region 30 with respect to the data region. Therefore, whenever the data is written on the data region 30, the counter region 40 with respect to the data region 30 increases its value by 1 (one).

The operation and effects of the semiconductor memory device and the data writing method thereof will now be explained with reference to the accompanying drawings.

To begin with, when it is necessary to write the data on the EEPROM 20 during the operation of the microcomputer 10, the microcomputer 10 outputs a data writing command. When the data writing command is generated, the microcomputer 10 outputs a chip selection signal CS for selecting a certain EEPROM 20. When the chip selection signal CS is applied thereto, the EEPROM 20 outputs a ready signal RDY, which indicates that whether the EEPROM 20 is in a ready state for a certain operation or is in an operation, to the microcomputer 10. As a result after judging the existence of the ready signal RDY, when the EEPROM 20 is in an operation, the microcomputer 10 selects another EEPROM or waits until the EEPROM 10 becomes a ready state.

Figure 1:
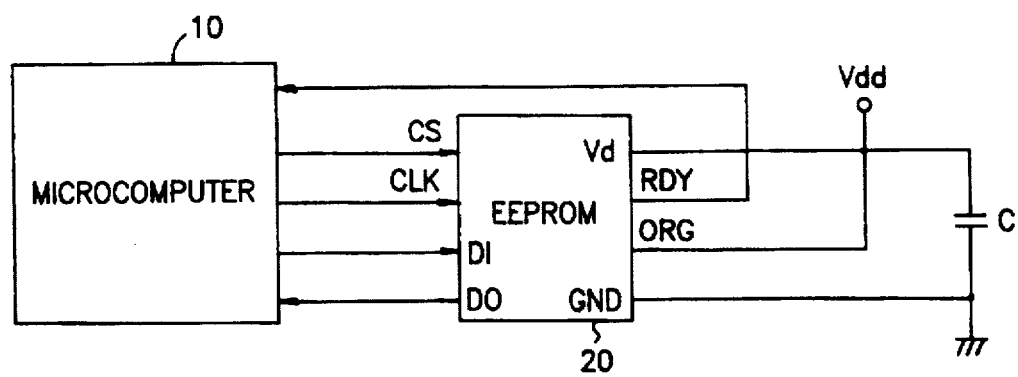
FIG. 1 is a block diagram of a conventional circuit between a microcomputer and an EEPROM.
Figure 2:
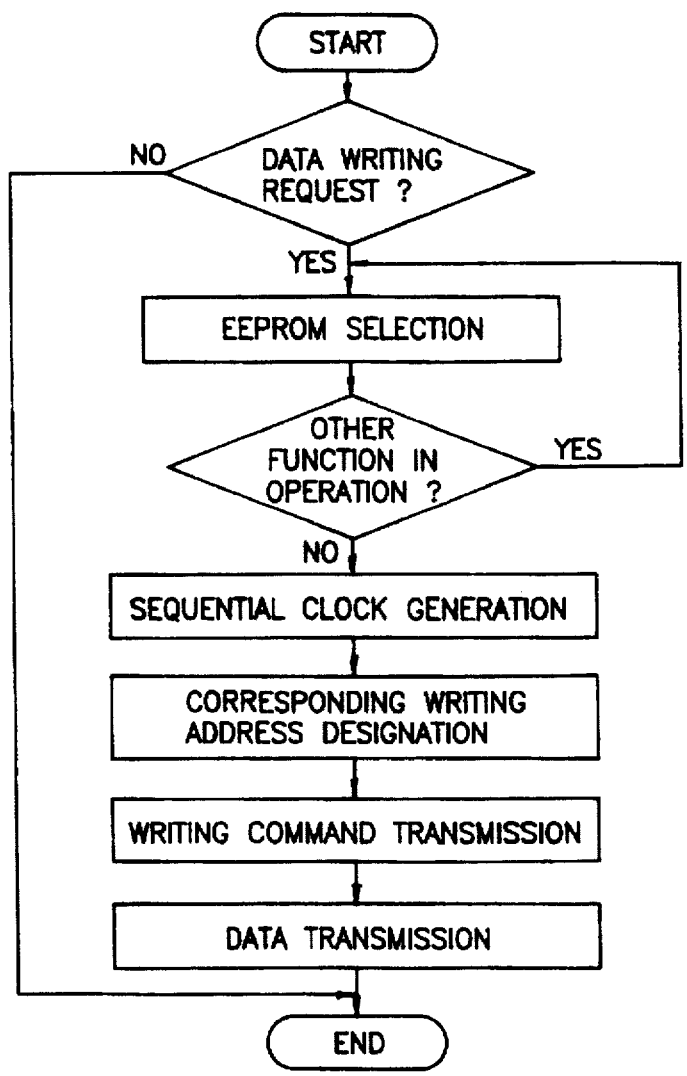
FIG. 2 is a flow chart of a method of writing data on an EEPROM in the conventional art.
Figure 3:
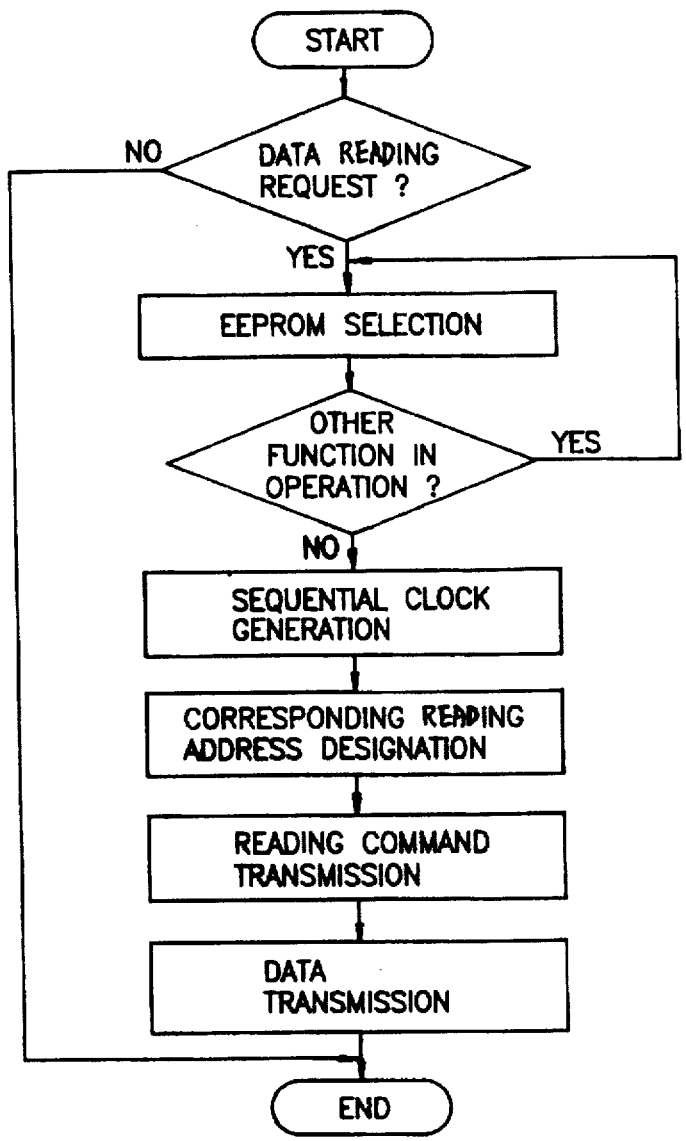
FIG. 3 is a flow chart of a method of reading data from an EEPROM in the conventional art.
Figure 4:
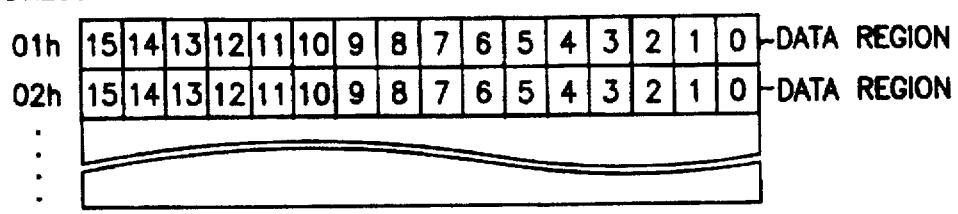
FIG. 4 is a view of a construction of a conventional EEPROM.

As a result after judging the ready signal RDY, the EEPROM 20 is not in an operation state, the microcomputer 10 reads the value from the first counter region 40 (address: $\phi$2h) of the EEPROM 20. When the count value read from the counter region 40 is larger than the effective number of the maximum writing, the microcomputer 10 recognizes that the counter region 40 and the data region 30 (address: $\phi$1h) consisting of a pair of addresses are not used no more and selects the next address (currently read address +2=$\phi$4h) and repeats the above-mentioned procedure. When the count value which is read from a certain counter region 40 is smaller than the effective number of the maximum writing, the microcomputer 10 designates the data region 30 corresponding to the address of the counter region 40 as an address on which the data is written (that is, the address −1 of the counter region 40. After the address is designated in the above-mentioned method, the microcomputer 10 outputs a clock signal CLK and a writing command to the EEPROM 10 and outputs the data to be written. The data outputted from the microcomputer 10 is written on the data region 30 of the EEPROM 20 in which a corresponding address is designated. The address of the counter region 40 corresponding to the address of the data region 30 increases its counted value by 1 (one). Meanwhile, the procedure of reading the data written on the EEPROM 20 is the same as in FIG. 3.

As described above, the semiconductor memory device and a data writing method thereof according to the present invention is directed to preventing electrical breakage of the corresponding address and written data error as the data is predominantly written on a certain address, thus lengthening the life span of the semiconductor memory device.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A semiconductor memory device, comprising:

a memory location having a pair of regions;

the pair of regions comprising a data region at a first address for storing data which is written thereinto and a counter region corresponding to the data region, the counter region being adjoined to the data region and having a second address which immediately follows the address of the data region, said counter region serving for storing therein a count value indicating the number of times that data has been written in the data region.

2. The semiconductor memory device of claim 1, wherein the count value in the counter region is incremented by one each time data is written into the corresponding data region.

3. The semiconductor memory device of claim 2, wherein the data region has an odd numbered address and the corresponding counter region has an even numbered address.

4. A data writing method for a semiconductor memory device, comprising the steps of:

reading a value indicating the number of times that data has been written into a certain address of a data region when a data writing request is given;

designating the certain address as an address on which data is to be written when the read value is less than a certain value and writing the data at the certain address; and selecting another address of the data region when the read value is greater than the certain value and repeating said reading and designating steps.

5. The method of claim 4, wherein each address of said data region makes a pair together with each address of the counter region, respectively, so that whenever a certain data is written on an address of the data region, the count value of each address of the counter region is increased by one (1), and thus the number that the data is written on the address of the data region is counted.

6. The method of claim 4, wherein said certain value is the effective number of the maximum writing of the data region.

7. A data writing method for a semiconductor memory device, comprising the steps of:

reading a value of a counter region corresponding to a data region;

comparing the read counter region value with a predetermined value;

writing data into the data region if the read value is less than the predetermined value and incrementing the counter region value by one, and repeating the reading and comparing steps; and incrementing the address of the data region if the read value equals the predetermined value.

8. The method of claim 7, wherein the predetermined value corresponds to a maximum number of times that data may be written into the data region.

* * * * *